(12) United States Patent
van der Meulen

(10) Patent No.: US 8,029,226 B2
(45) Date of Patent: Oct. 4, 2011

(54) SEMICONDUCTOR MANUFACTURING SYSTEMS

(75) Inventor: Peter van der Meulen, Newburyport, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 301 days.

(21) Appl. No.: 12/239,717

(22) Filed: Sep. 26, 2008

(65) Prior Publication Data

US 2009/0087286 A1 Apr. 2, 2009

Related U.S. Application Data

(63) Continuation-in-part of application No. 11/679,829, filed on Feb. 27, 2007, now abandoned, and a continuation-in-part of application No. 10/985,834, filed on Nov. 10, 2004, now Pat. No. 7,458,763.

(60) Provisional application No. 60/777,443, filed on Feb. 27, 2006, provisional application No. 60/518,823, filed on Nov. 10, 2003, provisional application No. 60/607,649, filed on Sep. 7, 2004, provisional application No. 60/975,350, filed on Sep. 26, 2007.

(51) Int. Cl.
*B65G 49/07* (2006.01)

(52) U.S. Cl. ........................ 414/217; 414/939

(58) Field of Classification Search ................... 414/217, 414/939
See application file for complete search history.

(56) References Cited

U.S. PATENT DOCUMENTS

| | | | | |
|---|---|---|---|---|
| 5,286,296 A | * | 2/1994 | Sato et al. | 118/719 |
| 5,609,689 A | * | 3/1997 | Kato et al. | 118/719 |
| 6,042,623 A | * | 3/2000 | Edwards | 29/25.01 |
| 6,440,261 B1 | * | 8/2002 | Tepman et al. | 414/222.01 |
| 6,450,750 B1 | * | 9/2002 | Heyder et al. | 414/217 |
| 6,841,006 B2 | * | 1/2005 | Barnes et al. | 118/719 |
| 6,852,194 B2 | * | 2/2005 | Matsushita et al. | 156/345.32 |
| 7,874,781 B2 | * | 1/2011 | Nozawa et al. | 414/217 |
| 2008/0175694 A1 | * | 7/2008 | Park et al. | 414/217.1 |

\* cited by examiner

*Primary Examiner* — James Keenan
(74) *Attorney, Agent, or Firm* — Perman & Green, LLP; Richard Pickreign

(57) ABSTRACT

Linear semiconductor handling systems provide more balanced processing capacity using various techniques to provide increased processing capacity to relatively slow processes. This may include use of hexagonal vacuum chambers to provide additional facets for slow process modules, use of circulating process modules to provide more processing capacity at a single facet of a vacuum chamber, or the use of wide process modules having multiple processing sites. This approach may be used, for example, to balance processing capacity in a typical process that includes plasma enhanced chemical vapor deposition steps and bevel etch steps.

10 Claims, 6 Drawing Sheets

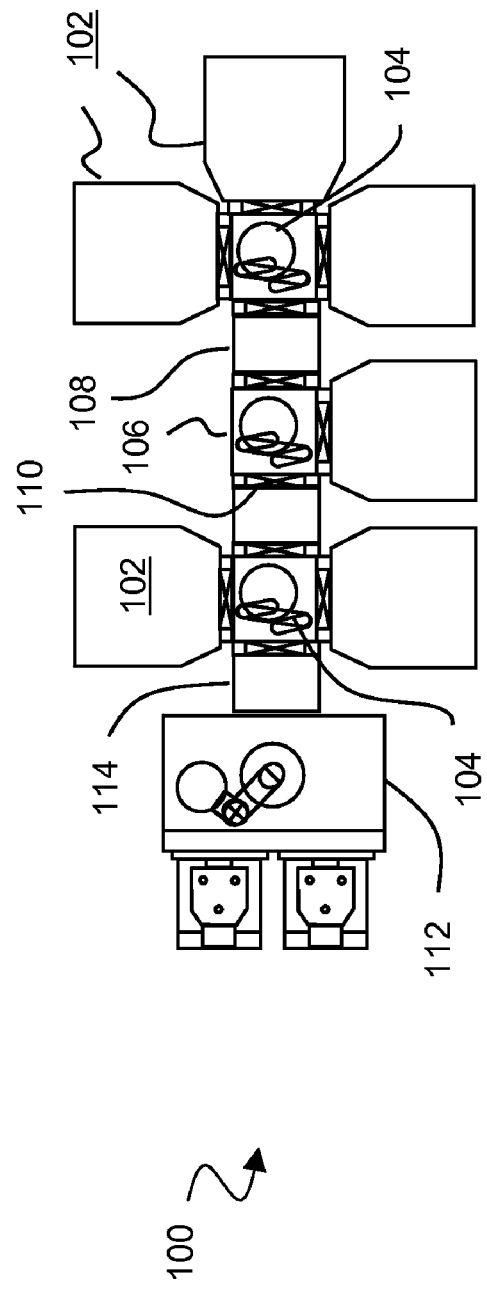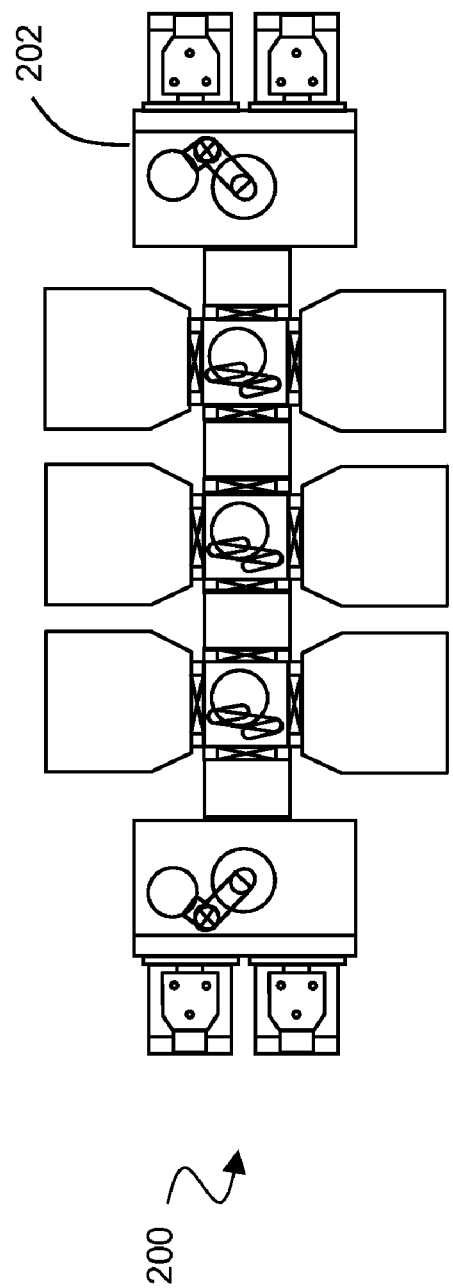

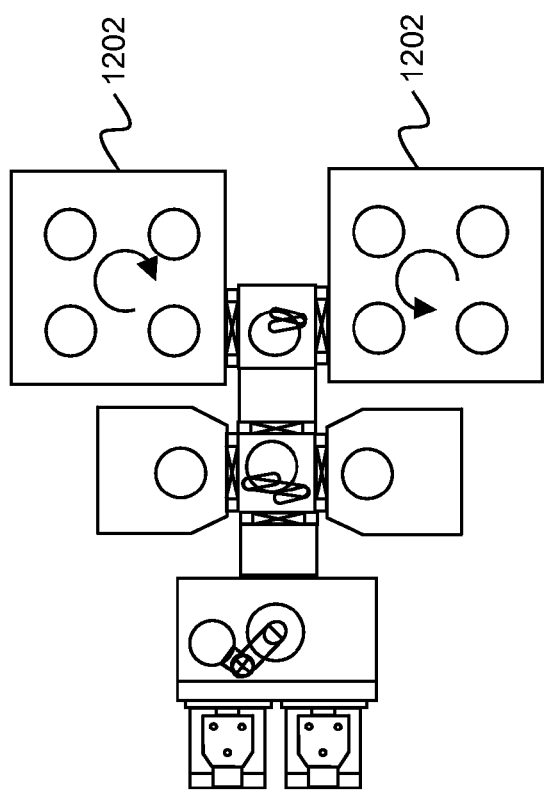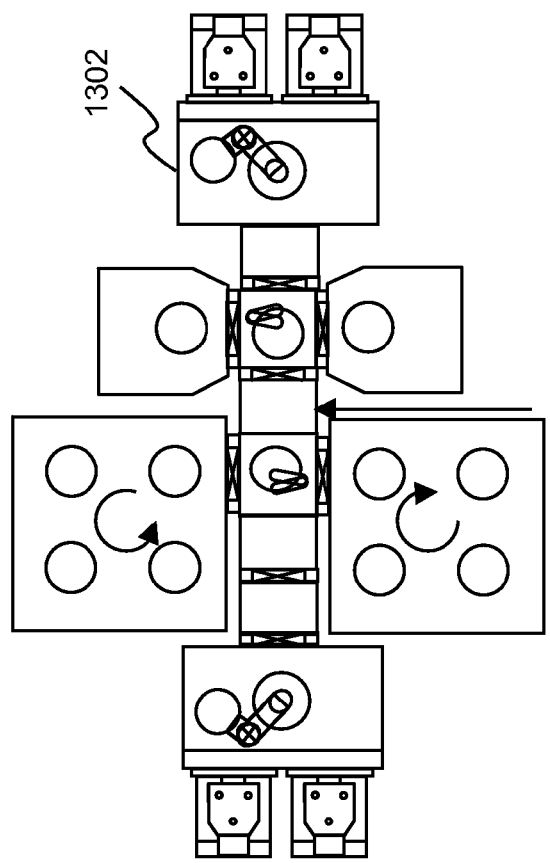

SEMICONDUCTOR MANUFACTURING SYSTEMS

RELATED APPLICATIONS

This application is a continuation-in-part of U.S. application Ser. No. 11/679,829 filed on Feb. 27, 2007, which claims the benefit of U.S. Prov. App. No. 60/777,443 filed on Feb. 27, 2006, and which is a continuation-in-part of U.S. application Ser. No. 10/985,834 filed on Nov. 10, 2004 which claims the benefit of U.S. Prov. App. No. 60/518,823 filed on Nov. 10, 2003 and U.S. Prov. App. No. 60/607,649 filed on Sep. 7, 2004.

This application also claims the benefit of U.S. App. No. 60/975,350 filed on Sep. 26, 2007.

All of the foregoing applications are commonly owned, and all of the foregoing applications are incorporated herein by reference.

BACKGROUND

This invention relates to the field of semiconductor manufacturing.

While various process modules and other semiconductor handling and fabrication tools are available, there remains a need for modular systems arranged to balance processing capacity for relatively fast processes such as bevel etching and relatively slow processes such as enhanced plasma chemical vapor deposition. More generally, a need exists for improved semiconductor manufacturing and handling equipment.

SUMMARY

Linear semiconductor handling systems provide more balanced processing capacity using various techniques to provide increased processing capacity to relatively slow processes. This may include use of hexagonal vacuum chambers to provide additional facets for slow process modules, use of circulating process modules to provide more processing capacity at a single facet of a vacuum chamber, or the use of wide process modules having multiple processing sites. This approach may be used, for example, to balance processing capacity in a typical process that includes plasma enhanced chemical vapor deposition steps and bevel etch steps.

In one aspect, an apparatus described herein includes an equipment front end module that physically handles workpieces in atmosphere; a load lock coupled to the equipment front end module and positioned to receive workpieces therefrom, the load lock providing for transfer of workpieces between atmosphere and a vacuum environment; a first vacuum chamber containing a robot, the first vacuum chamber having four facets, one of the four facets selectively coupled to the load lock by an isolation valve; two process modules that provide a first process, the two process modules coupled in a vacuum-sealed engagement to two opposing ones of the four facets in a vacuum-sealed engagement; two wide process modules, each having two entrances, and each providing a second process; and a second vacuum chamber containing two robots and a transfer station, the second vacuum chamber coupled in a vacuum-sealed engagement to one of the four facets of the first vacuum chamber, the two wide process modules positioned on opposing sides of the second vacuum chamber with each of the robots of the second vacuum chamber positioned between an entrance of each of the two wide process modules, the robots further positioned to transfer workpieces between one another; wherein workpieces can be transferred among the load lock, the two process modules, and the two wide process modules in vacuum by the robots of the first vacuum chamber and the second vacuum chamber, and wherein a processing speed of the two process modules is substantially balanced with the processing speed of the two wide process modules.

In another aspect, an apparatus described herein includes an equipment front end module that physically handles workpieces in atmosphere; a load lock coupled to the equipment front end module and positioned to receive workpieces therefrom, the load lock providing for transfer of workpieces between atmosphere and a vacuum environment; a first vacuum chamber containing a robot, the first vacuum chamber having four facets, one of the four facets selectively coupled to the load lock by an isolation valve; two process modules that provide a first process, the two process modules coupled in a vacuum-sealed engagement to two opposing ones of the four facets in a vacuum-sealed engagement; four process modules that provide a second process, the four process modules each having an entrance, and each providing a second process; and a second vacuum chamber containing a second robot, the second vacuum chamber having six facets, the second vacuum chamber coupled in a vacuum-sealed engagement to one of the four facets of the first vacuum chamber, and four of the six facets coupled in a vacuum-sealed engagement to each of the four process modules respectively, the second robot positioned to transfer workpieces among the four process modules; wherein workpieces can be transferred among the load lock, the two process modules, and the four process modules in vacuum by the robots of the first vacuum chamber and the second vacuum chamber, and wherein a processing speed of the two process modules is substantially balanced with the processing speed of the four process modules. In another aspect, an apparatus described herein includes an equipment front end module that physically handles workpieces in atmosphere; a load lock coupled to the equipment front end module and positioned to receive workpieces therefrom, the load lock providing for transfer of workpieces between atmosphere and a vacuum environment; a first vacuum chamber containing a robot, the first vacuum chamber having four facets, one of the four facets selectively coupled to the load lock by an isolation valve; two process modules that provide a first process, the two process modules coupled in a vacuum-sealed engagement to two opposing ones of the four facets in a vacuum-sealed engagement; two circulating process modules each having an entrance, and each providing a second process; and a second vacuum chamber containing a second robot, the second vacuum chamber having four facets, the second vacuum chamber coupled in a vacuum-sealed engagement to one of the four facets of the first vacuum chamber, and two of the four facets of the second vacuum chambered coupled in a vacuum-sealed engagement to each of the two circulating process modules respectively, the second robot positioned to transfer workpieces among the two circulating process modules; wherein workpieces can be transferred among the load lock, the two process modules, and the two circulating process modules in vacuum by the robots of the first vacuum chamber and the second vacuum chamber, and wherein a processing speed of the two process modules is substantially balanced with the processing speed of the two circulating process modules.

As used herein, "robot" shall include any kind of known robot or similar device or facility that includes a mechanical capability and a control capability, which may include a combination of a controller, processor, computer, or similar facility, a set of motors or similar facilities, one or more resolvers, encoders or similar facilities, one or more mechanical or operational facilities, such as arms, wheels, legs, links, claws, extenders, grips, nozzles, sprayers, end effectors, actuators, and the like, as well as any combination of any of the above. One embodiment is a robotic arm.

As used herein "drive" shall include any form of drive mechanism or facility for inducing motion. In embodiments it includes the motor/encoder section of a robot.

As used herein, "axis" shall include a motor or drive connected mechanically through linkages, belts or similar facilities, to a mechanical member, such as an arm member. An "N-axis drive" shall include a drive containing N axes; for example a "2-axis drive" is a drive containing two axes.

As used herein, "arm" shall include a passive or active (meaning containing motors/encoders) linkage that may include one or more arm or leg members, bearings, and one or more end effectors for holding or gripping material to be handled.

As used herein, "SCARA arm" shall mean a Selectively Compliant Assembly Robot Arm (SCARA) robotic arm in one or more forms known to those of skill in the art, including an arm consisting of one or more upper links connected to a drive, one or more lower links connected through a belt or mechanism to a motor that is part of the drive, and one or more end units, such as an end effector or actuator.

As used herein, "turn radius" shall mean the radius that an arm fits in when it is fully retracted.

As used herein, "reach" shall include, with respect to a robotic arm, the maximum reach that is obtained when an arm is fully extended. Usually the mechanical limit is a little further out than the actual effective reach, because it is easier to control an arm that is not completely fully extended (in embodiments there is a left/right singularity at full extension that can be hard to control).

As used herein, "containment" shall mean situations when the arm is optimally retracted such that an imaginary circle can be drawn around the arm/end effector/material that is of minimum radius.

As used herein, the "reach-to-containment ratio" shall mean, with respect to a robotic arm, the ratio of maximum reach to minimum containment.

As used herein, "robot-to-robot" distance shall include the horizontal distance between the mechanical central axis of rotation of two different robot drives.

As used herein, "slot valve" shall include a rectangular shaped valve that opens and closes to allow a robot arm to pass through (as opposed to a vacuum (isolation) valve, which controls the pump down of a vacuum chamber). For example, the SEMI E21.1-1296 standard (a published standard for semiconductor manufacturing) the slot valve for 300 mm wafers in certain semiconductor manufacturing process modules has an opening width of 336 mm, a opening height of 50 mm and a total valve thickness of 60 mm with the standard also specifying the mounting bolts and alignment pins.

As used herein, "transfer plane" shall include the plane (elevation) at which material is passed from a robot chamber to a process module chamber through a slot valve. Per the SEMI E21.1-1296 standard for semiconductor manufacturing equipment the transfer plane is 14 mm above the slot valve centerline and 1100 mm above the plane of the factory floor.

As used herein, "section" shall include a vacuum chamber that has one or more robotic drives in it. This is the smallest repeatable element in a linear system.

As used herein, "link" shall include a mechanical member of a robot arm, connected on both ends to another link, an end effector, or the robot drive.

As used herein, "L1," "L2", "L3" or the like shall include the numbering of the arm links starting from the drive to the end effector.

As used herein, "end effector" shall include an element at an active end of a robotic arm distal from the robotic drive and proximal to an item on which the robotic arm will act. The end effector may be a hand of the robot that passively or actively holds the material to be transported in a semiconductor process or some other actuator disposed on the end of the robotic arm.

As used herein, the term "SCARA arm" refers to a robotic arm that includes one or more links and may include an end effector, where the arm, under control, can move linearly, such as to engage an object. A SCARA arm may have various numbers of links, such as 3, 4, or more. As used herein, "3-link SCARA arm" shall include a SCARA robotic arm that has three members: link one (L1), link two (L2) and an end effector. A drive for a 3-link SCARA arm usually has 3 motors: one connected to L1, one to the belt system, which in turn connects to the end effector through pulleys and a Z (lift) motor. One can connect a fourth motor to the end effector, which allows for some unusual moves not possible with only three motors.

As used herein, "dual SCARA arm" shall include a combination of two SCARA arms (such as two 3 or 4-link SCARA arms (typically designated A and B)) optionally connected to a common drive. In embodiments the two SCARA arms are either completely independent or share a common link member L1. A drive for a dual independent SCARA arm usually has either five motors: one connected to L1-A, one connected to L1-B, one connected to the belt system of arm A, one connected to the belt system of arm B, and a common Z (lift) motor. A drive for a dual dependent SCARA arm usually has a common share L1 link for both arms A and B and contains typically four motors: one connected to the common link L1, one connected to the belt system for arm A, one connected to the belt system for arm B, and a common Z (lift) motor.

As used herein, "4-link SCARA arm" shall include an arm that has four members: L1, L2, L3 and an end effector. A drive for a 4-link SCARA arm can have four motors: one connected to L1, one to the belt systems connected to L2 and L3, one to the end effector and a Z motor. In embodiments only 3 motors are needed: one connected to L1, one connected to the belt system that connects to L2, L3 and the end effector, and a Z motor.

As used herein, "Frog-leg style arm" shall include an arm that has five members: L1A, L1B, L2A, L3B and an end effector. A drive for a frog-leg arm can have three motors, one connected to L1A—which is mechanically by means of gearing or the like connected to L1B—, one connected to a turret that rotates the entire arm assembly, and a Z motor. In embodiments the drive contains three motors, one connected to L1A, one connected to L1B and a Z motor and achieves the desired motion through coordination between the motors.

As used herein, "Dual Frog-leg style arm" shall include an arm that has eight members L1A, L1B, L2A-1, L2A-2, L2B-1, L2B-2 and two end effectors. The second link members L2A-1 and L2B-1 form a single Frog-leg style arm, whereas the second link members L2A-2 and L2B-2 also form a single Frog-leg style arm, however facing in an opposite direction. A drive for a dual frog arm may be the same as for a single frog arm.

As used herein, "Leap Frog-leg style arm" shall include an arm that has eight members L1A, L1B, L2A-1, L2A-2, L2B-1, L2B-2 and two end effectors. The first link members L1A and L1B are each connected to one of the motors substantially by their centers, rather than by their distal ends. The second link members L2A-1 and L2B-1 form a single Frog-leg style arm, whereas the second link members L2A-2 and L2B-2 also form a single Frog-leg style arm, however facing in the same direction. A drive for a dual frog arm may be the same as for a single frog arm.

BRIEF DESCRIPTION OF THE FIGURES

The foregoing and other objects and advantages of the invention will be appreciated more fully from the following further description thereof, with reference to the accompanying drawings, wherein:

FIG. 1 shows a linear processing architecture for handling items in a semiconductor fabrication process.

FIG. 2 shows an alternative layout for a system.

FIG. 12 shows a system employing two circulating process modules to balance processing capacity.

FIG. 13 shows a system employing circulating process modules to balance processing capacity.

DETAILED DESCRIPTION

Figure 3:
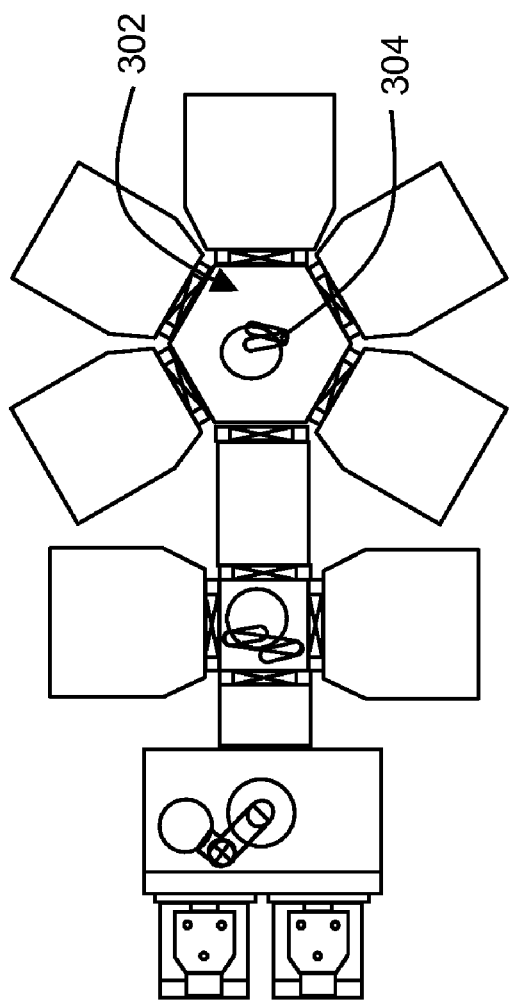
FIG. 3 shows an alternative layout for a system.

FIG. 1 shows a linear processing architecture for handling items in a semiconductor fabrication process. The system 100 may include a number of process modules 102 for various processes such as chemical vapor deposition processes, etching processes, and the like. As semiconductor manufacturing processes are typically extremely sensitive to contaminants, such as particulates and volatile organic compounds, the processes typically take place in a vacuum environment, with one or more process modules 102 that are devoted to specific processes. Semiconductor wafers are moved among the process modules 102 by a handling system that may include one or more robots 104 to produce the end product, such as a chip. Various configurations exist for handling systems. A prevalent system is a cluster tool, where process modules are positioned radially around a central handling system, such as a robotic arm. In other embodiments, a handling system can rotate items horizontally in a "lazy Susan" facility. Process modules 102 may in general be clustered, stacked, or arranged in a linear fashion as depicted in FIG. 1. A given chip may require chemical vapor deposition of different chemical constituents (e.g., Titanium Nitride, Tungsten, etc.) in different process modules, as well as etching in other process modules. The sequence of the processes in the different process modules may produce a unique end product.

In general, the system 100 may use two or more stationary robots 104 arranged in a linear fashion. The robots 104 may be mounted in the bottom of the system 100 or hang down from the chamber lid or both at the same time. The linear system may use a vacuum chamber 106 around each robot, and may have multiple connected vacuum chambers 106, each containing its own robot 104 arranged in a linear fashion. In general, different forms of robots can be used in semiconductor manufacturing equipment. Possible robots include 3-link Selective Compliant Articulated Robot Arm ("SCARA") robot, a 4-link SCARA robot, a dual-arm robot, a frog-leg arm robot, and so forth.

In embodiments, a single controller could be set up to handle one or more sections of the system 100. In embodiments vacuum chambers 106 are extensible; that is, a manufacturer can easily add additional sections/chambers 106 and thus add process capacity. Because each section can use independent robot arms and robot drives, the throughput may stay high when additional sections and thus robots 104 are added.

In embodiments the components of the system 100 can be controlled by a software controller, which in embodiments may be a central controller that controls each of the components. In embodiments the components form a linkable handling system under control of the software, where the software controls each robot to hand off a material to another robot, or into a buffer for picking up by the next robot. In embodiments the software control system may recognize the addition of a new component, such as a process module or robot, when that component is plugged into the system, such as recognizing the component over a network, such as a USB, Ethernet, FireWire, Bluetooth, 802.11a, 802.11b, 802.11g or other network. In such embodiments, as soon as the next robot, process module, or other component is plugged in a software scheduler for the flow of a material to be handled, such as a wafer, can be reconfigured automatically so that the materials can be routed over the new link in the system. In embodiments the software scheduler is based on a neural net, or it can be a rule-based scheduler. In embodiments process modules can make themselves known over such a network, so that the software controller knows what new process modules, robots, or other components have been connected. When a new process module is plugged into an empty facet, the system can recognize it and allow it to be scheduled into the flow of material handling.

In embodiments the software system may include an interface that permits the user to run a simulation of the system. The interface may allow a user to view the linking and configuration of various links, robotic arms and other components, to optimize configuration (such as by moving the flow of materials through various components, moving process modules, moving robots, or the like), and to determine what configuration to purchase from a supplier. In embodiments the interface may be a web interface.

The methods and system disclosed herein can use optional buffer stations 108 between robot drives. Robots could hand off to each other directly, but that is technically more difficult to optimize, and would occupy two robots, because they would both have to be available at the same time to do a handoff, which is more restrictive than if they can deposit to a dummy location 108 in-between them where the other robot can pick up when it is ready. The buffer 108 also allows higher throughput, because the system does not have to wait for both robots to become available. Furthermore, the buffers 108 may also offer a good opportunity to perform some small processing steps on the wafer such as heating, cooling, aligning, inspection, metrology, testing or cleaning.

In embodiments, the methods and systems disclosed herein use optional vacuum isolation valves 110 between robot areas/segments. Each segment can be fully isolated from any other segment. If a robot 104 handles ultra clean and sensitive materials (e.g., wafers) in its segment, then isolating that segment from the rest of the system may prevent cross-contamination from the dirtier segment to the clean segment. Also, the manufacturer can now operate segments at different pressures. The manufacturer can have stepped vacuum levels where the vacuum gets better and better further into the machine. The use of isolation valves 110 may avoid outgassing from materials or wafers in other parts of the system when handling a wafer in an isolated segment. In embodiments, vacuum isolation between robots 104 is possible, as is material buffering between robots 104.

An equipment front end module 112 or the like may be employed for loading and unloading wafer from the system 100. This may include a variety of robotics, as well as aligners, shelving for wafers and/or wafer carriers, and so forth. Wafers may be transferred between the atmospheric environment of the equipment front end module 112 and the vacuum environment of the process modules 102, robot 104, and so forth through a load lock 114. It should be understood that while in some embodiments a load lock 114 may be positioned at the end of a linear system, as depicted in FIG. 1, the load lock 114 may also or instead be positioned elsewhere, such as in the middle of the system. In such an embodiment, a manufacturing item could enter or exit the system at such another point in the system, such as to exit the system into the air return.

Other features of the system 100 may include an external or air return for moving wafers or groups of wafers in atmosphere, which may optionally be on the top of the linear vacuum chamber. The return system could also be a vacuum return. It should also be understood that while several of the depicted embodiments of linear semiconductor fabrication systems are laid out in a straight line, the linear system could be curvilinear; that is, the system could have curves, a U- or V-shape, an S-shape, or a combination of those or any other curvilinear path, in whatever format the manufacturer desires, such as to fit the configuration of a fabrication facility. In each case, the system optionally includes an entry point and an exit point that is down the line from the entry point. Optionally the air return returns the item from the exit point to the entry point. Optionally the system can include more than one exit point. In each case the robotic arms described herein can assist in efficiently moving items down the line.

In general, the depicted system 100 is arranged to service six process modules (an additional process module may be positioned in the top middle of the depicted system 100, but is omitted here to provide room for element numbers) using three robots 104 with four sided vacuum chambers 106.

It will be further understood that many modifications and additions to the system described above may be usefully employed, including various robot types, various layouts, various process module and robot chamber sizes FIG. 2 shows an alternative layout for a system 200 that adds a rear-exit handler 202 which may be, for example, similar to the equipment front end module 112 of FIG. 1. This arrangement permits generally left-to-right processing and handling of wafers as well as various other paths through process modules and entry/exit points.

FIG. 3 shows an alternative layout for a system 300 using a hexagonal vacuum chamber 302 providing six facets for one of the robots 304. By employing a robotic handler with six facets, a number of additional process modules can be added. This may be particularly useful where a process requires numerous, smaller process modules.

Figure 4:
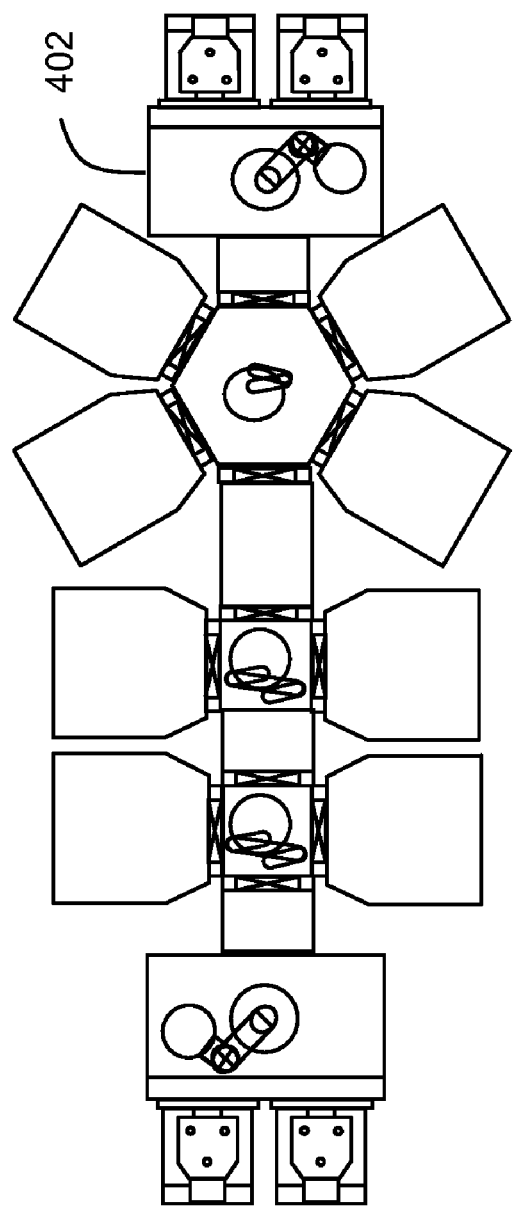
FIG. 4 shows an alternative layout for a system.

FIG. 4 shows an alternative layout for a system 400 using square and hexagonal vacuum chambers, along with a rear-exit handler 402. This arrangement may permit relatively dense clustering of both large and small process modules. In addition, the availability of front and rear access to atmosphere expands options for throughput and scheduling.

Figure 5:
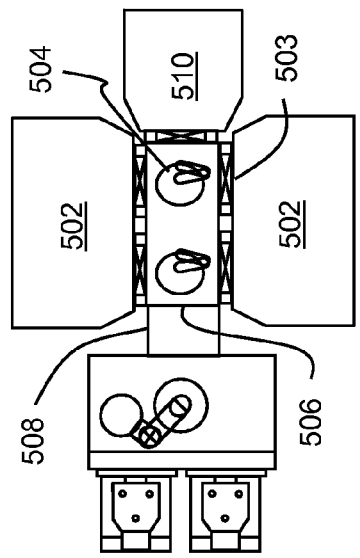
FIG. 5 shows a system using wide process modules.

FIG. 5 shows a system 500 including wide process modules 502. Each wide process module 502 may have two entrances 503 coupled in a vacuum sealed engagement to a vacuum chamber 506 that contains a number of robots 504. In one embodiment, the robots 504 may be positioned between entrances 503 of opposing wide process modules 502 so that one robot can access an entrance 503 of each one of the process modules. The wide process modules 502 may provide concurrent and/or asynchronous processing of multiple workpieces, which may include, for example, two similar processes that may be accessed independently by the two robots 504 through each of the side-by-side entrances 504. In other embodiments, a wide process module 502 may provide two side-by-side sequential steps or processes, which may be performed entirely within the process module (so that a workpiece enters one entrance and leaves through the other entrance, or by accessing each process through respective entrances with the robots 504. It will be noted that the robots 504 may also affect robot-to-robot handoff among themselves, or transfer workpieces between themselves via a transfer station, buffer station, or the like, so that workpieces may more generally be moved to various facets of the vacuum chamber 506 that contains the robots 504. The robots 504 may thus, for example, transfer a workpiece from a load lock 508 through the vacuum chamber 506 to a process module 510 on an opposing side.

Figure 6:
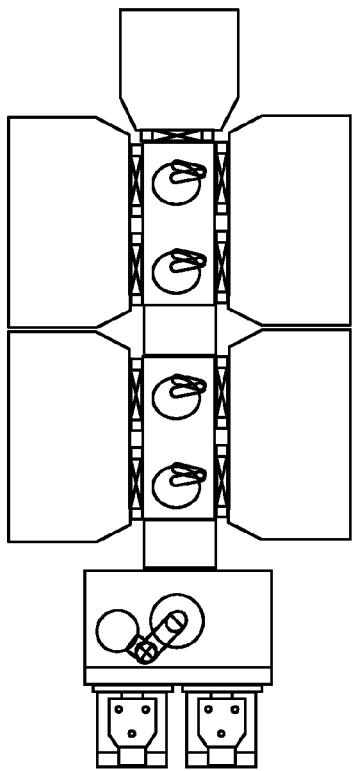
FIG. 6 shows another system using multiple wide process modules.

FIG. 6 shows another system 600 using multiple wide process modules. In this embodiment two pairs of wide process modules are arranged on each side of a linear system, with four robots sharing a vacuum environment via an intervening transfer station. Each process module, or each entrance to each process module, may be selectively coupled to the interior of the vacuum chambers by an isolation valve or the like.

Figure 7:
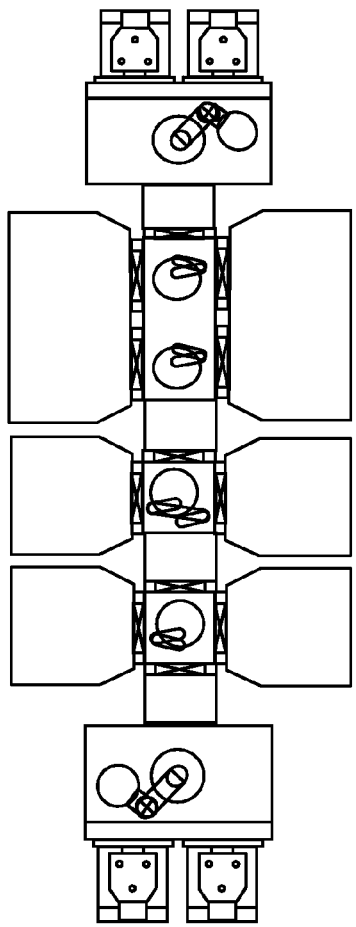
FIG. 7 shows another system using multiple wide process modules.

FIG. 7 shows another system 700 using multiple wide process modules. It will be noted that wide process modules may be combined with other process modules, which may be selected according to the relative process times thereof to provide balanced capacity between the various processes. Thus in general a wide process module may be provided for processing multiple workpieces where the wide process modules provide a relatively long process, while single-workpiece process modules may be provided for relatively short processes. It will further be noted that a rear-exit handler may be included to add another entry and/or exit point to a vacuum interior of the system 700.

In general, while certain arrangements are depicted, it will be understood that numerous other physical layouts are possible including various placements of wide process modules, other process modules, and the various process modules described below, as well as load locks, front end handlers, and the like, without departing from the scope of this disclosure.

Figure 8:
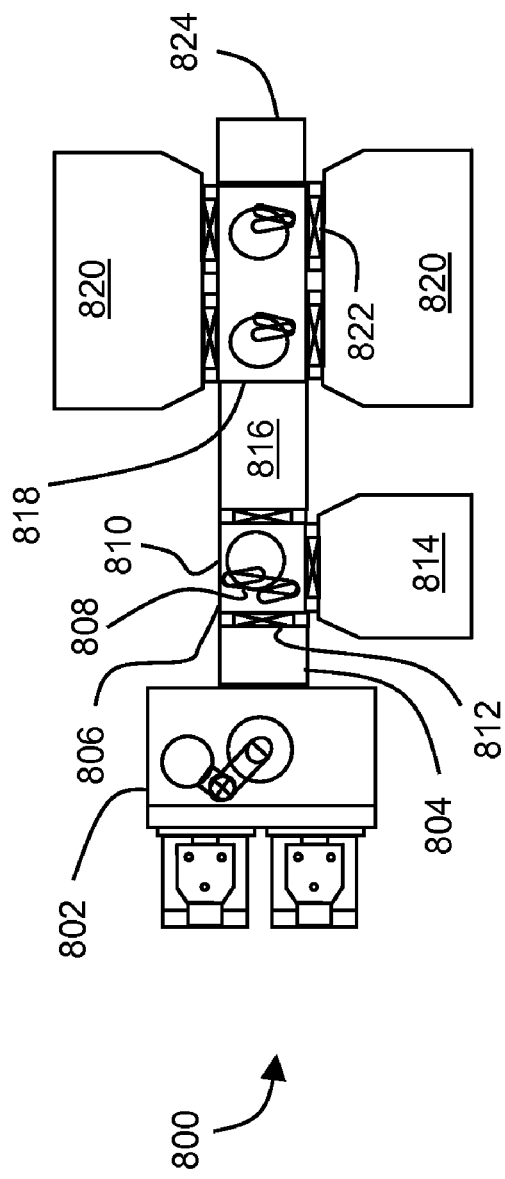
FIG. 8 shows a system employing wide process modules to balance processing capacity.

FIG. 8 shows a system employing wide process modules to balance processing capacity.

The system 800 may include an equipment front end module 802 that physically handles workpieces in atmosphere, and assists in transferring workpieces between atmosphere and a vacuum interior of the system 800. The equipment front end module 802 may include buffers, storage shelves, aligners, carrier holders and/or handlers, and so forth.

A load lock 804 may be coupled to the equipment front end module 802 and may be positioned to receive workpieces from the equipment front end module 802. The load lock 804 may in general provide for transfer of workpieces between atmosphere and the vacuum environment within the system

800. Numerous load locks are known in the art, and may be suitably employed with the system 800 as described herein. The load lock 804 may include a preheat station or other processing facility suitable for conditioning workpieces as they enter and/or exit the vacuum environment.

A first vacuum chamber 806 may contain a robot 808 for handling workpieces. The first vacuum chamber 806 may have four facets 810 arranged in a generally square shape, with one of the facets 810 coupled to the load lock 804 by an isolation valve 812 or the like.

Two process modules 814 that provide a first process may be coupled in a vacuum-sealed engagement to two opposing ones of the four facets 810 of the first vacuum chamber 806. It will be understood that only one process module 814 is depicted, but that an opposing facet 810 of the vacuum chamber 806 may readily accommodate an additional process module 814 as described herein. Each process module 814 may also be selectively coupled to the first vacuum chamber 806 by an isolation valve or the like. The two process modules 814 may provide a relatively fast process such as a bevel etch process or the like.

Two wide process modules 820 may be provided, each having two entrances 822. Each of the wide process modules 820 may provide a second process. In one aspect, the second process may be a relatively slow process, such as a plasma enhanced chemical vapor deposition process. By providing processing for multiple workpieces at one time, each wide process module 820 may, even where the second process is relatively slow, balance the capacity of a relatively fast process such as the bevel etch process described above.

A second vacuum chamber 818 may include two or more additional robots and a transfer station 816. The second vacuum chamber 818 may be coupled in a vacuum-sealed engagement to one of the four facets of the first vacuum chamber 806. The two wide process modules 820 may be positioned on opposing sides of the second vacuum chamber, with each of the robots in the second vacuum chamber 818 positioned between an entrance of each of the two wide process modules. The robots may further be positioned to transfer workpieces between one another, permitting greater mobility of workpieces within the vacuum environment of the system 800. The transfer station may be adapted to perform one or more of a heating, a cooling, an aligning, an inspection, a metrology, a testing or a cleaning by the addition of suitable hardware and/or software that is generally known in the art.

In the system 800, workpieces may be transferred among the load lock 804, the two process modules 814, and the two wide process modules 820 in vacuum by the robots of the first vacuum chamber and the second vacuum chamber. The processing speed of the two process modules 814 may be substantially balanced with the processing speed of the two wide process modules 820. It will be understood that the reference to balancing here does not require precise equality of processing time. Rather, balancing as used herein refers to the general notion of providing parallel handling as appropriate to balance the processing speed of fast processes, so that utilization of fast process modules is generally improved. In general, any of the components such as the load lock 804, process modules 814, wide process modules 820, vacuum chambers 806, 818 may be selectively coupled to one another using isolation valves or the like.

A typical process flow for the system 800 may, by way of non-limiting example, include the following steps: (a) preheat workpiece for 20-30 seconds (within load lock, or within a separate preheat station between the load lock and the first vacuum chamber), (b) transfer workpiece to a plasma enhanced chemical vapor deposition (PE-CVD) chamber of one of the wide process modules, (c) process for 60-120 seconds, followed by a clean cycle, (d) transfer workpiece from the PE-CVD chamber to a cool-down location such as the transfer station, (e) cool down 20-30 seconds, (f) transfer to bevel etch process chamber, (g) process workpiece with bevel etch process for 30-60 seconds, (h) return workpiece to load lock. It will be appreciated that more generally steps may be added, omitted, modified, or rearranged, and that a variety of different processes may be performed using one or more of the process modules described above.

Figure 9:
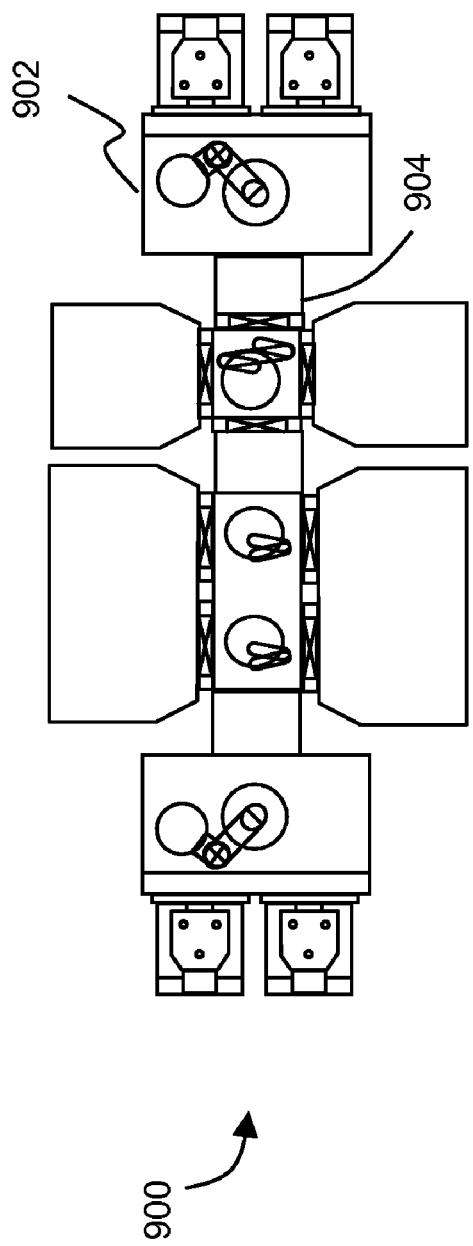
FIG. 9 shows a system employing wide process modules to balance processing capacity.

FIG. 9 shows a system employing wide process modules to balance processing capacity. In general, the system 900 may be similar to the system 800 described above, with differences noted as follows. The system 900 may include a rear-exit handler 902, which may be coupled through a second load lock 904 to the second vacuum chamber. The rear-exit handler 902 may provide a second exit point for workpieces to and from the vacuum interior of the system 900.

Figure 10:
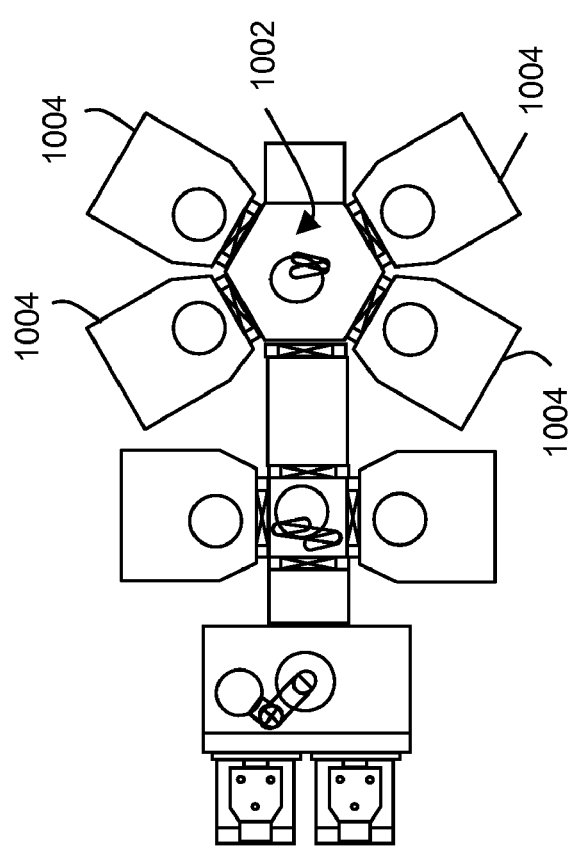
FIG. 10 shows a system employing a hexagonal vacuum chamber to balance processing capacity.

FIG. 10 shows a system employing a hexagonal vacuum chamber to balance processing capacity. In general, the system 1000 may include components such as those described above including for example a number of relatively fast process modules, such as bevel etch process modules coupled to a square vacuum chamber, along with a balanced number of relatively slow process modules, such as PE-CVD process modules. However, rather than provide double wide process modules for increased PE-CVD capacity, the system 1000 shown in FIG. 10 uses a hexagonal vacuum chamber 1002 to provide additional facets so that more PE-CVD modules can be coupled to the vacuum system 1000.

Thus in one embodiment the system 1000 may include four process modules 1004 each having an entrance, and each providing a process such as a PE-CVD process. The vacuum chamber 1002 may have six facets, one of which may be coupled in a vacuum-sealed engagement to the square vacuum chamber, and four of which may be coupled in a vacuum-sealed engagement to the four process modules. The additional facet may be used, for example, for a heating, cooling, or other buffer or transfer station, or to couple to an additional vacuum chamber for additional process modules, or to couple to any other suitable vacuum processing hardware or the like. The vacuum chamber 1002 may also include a robot positioned to transfer workpieces among the six facets, and thus for example among the four process modules 1004 or any other connected hardware.

Figure 11:
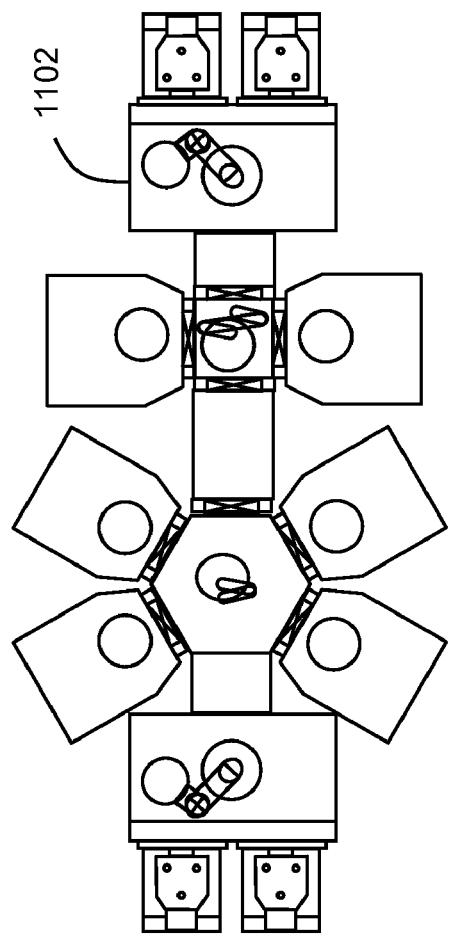
FIG. 11 shows a system employing a hexagonal vacuum chamber to balance processing capacity.

FIG. 11 shows a system employing a hexagonal vacuum chamber to balance processing capacity. In general, the system 1100 may employ any of the components and arrangements described above. The system may, for example, be similar to the system 1000 of FIG. 10 with the addition of a rear-exit handler 1102, examples of which are also described above.

FIG. 12 shows a system employing two circulating process modules to balance processing capacity. In general, the system 1200 may employ any of the components and arrangements described above including for example a number of relatively fast process modules, such as bevel etch process modules coupled to a square vacuum chamber, along with a balanced number of relatively slow process modules, such as PE-CVD process modules. However, rather than provide double wide process modules or hexagonal vacuum chambers to balance capacity, the system 1200 provides a number of circulating process modules 1202 to balance capacity.

A circulating process module 1202 may permit deposit of a number of workpieces, which may be loaded serially or the like, into a lazy Susan or similar handler or carousel for processing. Although four discrete locations are depicted in FIG. 12 for each circulating process module 1202, it will be understood that more generally any number of locations may be provided, and that movement of the workpieces within the circulating process module 1202 may follow circular motion or movement through some other rectangular or curvilinear path, and may in certain embodiments include vertical movement in a stack or the like. It will also be understood that while "circulating" suggests a repeating cycle of locations within the circulating process module 1202, in certain embodiments, loading and unloading may be performed in forward or reverse order, or the circulating process module 1202 may provide effectively random access to workpiece locations. It will further be understood that one location within the circulating process module 1202, which may be the load or unload location or any other suitable location, may provide cooling or other thermal management, alignment, or the like for workpieces added to and/or removed from the circulating process module. In one embodiment, the circulating process module 1202 provides a capacity for four workpieces including three PE-CVD processing locations, and one cooling location.

FIG. 13 shows a system employing circulating process modules to balance processing capacity. In general, the system 1300 may employ any of the components and arrangements described above. The system may, for example, be similar to the system 1200 of FIG. 12, with the addition of a rear-exit handler 1302, examples of which are also described above. The addition of a rear-exit handler 1302 may support additional workpiece paths through the system 1300, such as a generally left-to-right flow of workpieces through the system 1300 as illustrated in FIG. 13.

Having thus described several illustrative embodiments, it is to be appreciated that various alterations, modifications, and improvements will readily occur to those skilled in the art. Such alterations, modifications, and improvements are intended to form a part of this disclosure, and are intended to be within the spirit and scope of this disclosure. While some examples presented herein involve specific combinations of functions or structural elements, it should be understood that those functions and elements may be combined in other ways according to the present invention to accomplish the same or different objectives. In particular, acts, elements, and features discussed in connection with one embodiment are not intended to be excluded from similar or other roles in other embodiments. Accordingly, the foregoing description and attached drawings are by way of example only, and the invention is to be interpreted in the broadest sense allowable by law.

What is claimed is:

1. An apparatus comprising:
   an equipment front end module that physically handles workpieces in atmosphere;
   a load lock coupled to the equipment front end module and positioned to receive workpieces therefrom, the load lock providing for transfer of workpieces between atmosphere and a vacuum environment;
   a first vacuum chamber containing a robot, the first vacuum chamber having four facets, one of the four facets selectively coupled to the load lock by an isolation valve;
   two process modules that provide a first process, the two process modules coupled in a vacuum-sealed engagement to two opposing ones of the four facets in a vacuum-sealed engagement;
   two wide process modules, each having two entrances, and each providing a second process; and
   a second vacuum chamber containing two robots and a transfer station, the second vacuum chamber coupled in a vacuum-sealed engagement to one of the four facets of the first vacuum chamber, the two wide process modules positioned on opposing sides of the second vacuum chamber with each of the robots of the second vacuum chamber positioned between an entrance of each of the two wide process modules, the robots further positioned to transfer workpieces between one another;
   wherein workpieces can be transferred among the load lock, the two process modules, and the two wide process modules in vacuum by the robots of the first vacuum chamber and the second vacuum chamber, and wherein a processing speed of the two process modules is substantially balanced with the processing speed of the two wide process modules.

2. The apparatus of claim 1 wherein the load lock includes a preheat station.

3. The apparatus of claim 1 wherein the transfer station is adapted to perform one or more of a heating, a cooling, an aligning, an inspection, a metrology, a testing or a cleaning.

4. The apparatus of claim 1 wherein the first process is a bevel etch process.

5. The apparatus of claim 1 wherein the second process is a plasma enhanced chemical vapor deposition process.

6. The apparatus of claim 1 wherein the two process modules are selectively coupled to two opposing ones of the four facets of the first vacuum chamber by isolation valves.

7. The apparatus of claim 1 wherein the second vacuum chamber is coupled to one of the four facets of the first vacuum chamber by an isolation valve.

8. The apparatus of claim 1 further comprising a plurality of isolation valves that selectively isolate the entrances of the two wide process modules from the second vacuum chamber.

9. The apparatus of claim 1 further comprising a rear-exit handler coupled through a second load lock to the second vacuum chamber, thereby providing a second exit point for workpieces from a vacuum interior of the apparatus.

10. The apparatus of claim 9 wherein the rear-exit handler further provides a second entry point for workpieces into the vacuum interior of the apparatus.

* * * * *